(12) United States Patent
Almonte

(10) Patent No.: US 8,995,487 B1
(45) Date of Patent: Mar. 31, 2015

(54) LASER DRIVER SUBSYSTEM

(71) Applicant: nLIGHT Photonics Corporation, Vancouver, WA (US)

(72) Inventor: Kenneth V. Almonte, Porltand, OR (US)

(73) Assignee: nLight Photonics Corporation, Vancouver, WA (US)

( * ) Notice: Subject to any disclaimer, the term of this patent is extended or adjusted under 35 U.S.C. 154(b) by 20 days.

(21) Appl. No.: 13/764,629

(22) Filed: Feb. 11, 2013

(51) Int. Cl.
*H01S 3/02* (2006.01)

(52) U.S. Cl.
CPC .......................................... *H01S 3/02* (2013.01)
USPC ................... 372/38.02; 372/38.04; 372/38.07

(58) Field of Classification Search
USPC ....................................................... 372/38.02
See application file for complete search history.

(56) References Cited

U.S. PATENT DOCUMENTS

| | | | |
|---|---|---|---|
| 8,367,991 B2 | 2/2013 | Bradley | |
| 2002/0172486 A1* | 11/2002 | Fermann | 385/128 |
| 2011/0036998 A1* | 2/2011 | Bradley | 250/492.1 |
| 2012/0039349 A1* | 2/2012 | Priest et al. | 372/38.01 |

* cited by examiner

*Primary Examiner* — Xinning Niu
(74) *Attorney, Agent, or Firm* — Klarquist Sparkman, LLP

(57) ABSTRACT

A laser driver subsystem includes a pump diode driver, operable to generate light pulses to energize a laser, and a lithium polymer battery. The pump diode driver includes a pump diode and a switched-mode power conversion circuit at an input connected to an output of the battery and at an output connected to an anode of the pump diode. The switched-mode power conversion circuit is configured to convert an electrical voltage from a first level at the output of the battery to a second lower voltage level at the pump diode anode so as to provide the pump diode with an electrical current that enables the pump diode to generate the light pulses to operate the laser while only a fraction of that current needs to be supplied by the battery.

20 Claims, 3 Drawing Sheets

LASER DRIVER SUBSYSTEM

BACKGROUND OF THE INVENTION

1. Field of the Invention

Generally, the field of the present invention is systems for performing laser-based operations. More particularly, the present invention relates to an enhanced laser driver subsystem for use in such systems.

2. Background Art

Lasers that generate high power light pulses are commonly used in systems for performing some laser operations, such as range finding as only one example, that require high optical power laser pulses that make up transmitted and reflected signals. One such laser is a diode-pumped solid-state laser (DPSSL) energized by short, high energy pulses produced by a pump diode driver. This energy is delivered to the DPSSL by the electronics of the pump diode driver that control the pulse duration and regulate the electrical current that flows into the pump diode. Current into the driver can be on the order of tens to hundreds of amps, so this energy must be stored in such a way that it can be extracted quickly, in the form of high current pulses of a very short duration, to energize the laser.

Portable devices using the pump diode driver are typically powered by small disposable (primary) or re-chargeable primary batteries that provide the energy storage medium. These batteries, which each typically have a 1.2 to 3.0 volt output, are designed for long-term energy storage and cannot alone supply the high pulsed current required by the driver. Thus, typically, capacitors featuring low internal resistance are interposed between the primary batteries and the driver to provide short term storage and availability of the energy when needed in these situations because the capacitors can be charged and discharged almost instantly. However, these capacitors do not have a high energy density and are typically large and bulky. They also require additional on-board charger electronics to charge the capacitors to a particular required voltage. These requirements can create a packaging challenge for portable, hand-held products that need to be small and lightweight.

Thus, there remains a need for an innovation that will overcome the aforementioned shortcomings of these past practices.

SUMMARY OF THE INVENTION

The present invention is directed to an innovation that provides an enhanced laser driver subsystem that employs in conjunction with a pump diode driver a high discharge rate lithium polymer battery instead of conventional batteries, capacitors and charging circuit. The lithium polymer battery has a low internal resistance, enabling fast charging and discharging of the stored energy. The energy density of the lithium polymer battery is much greater than a typical aluminum or aluminum polymer capacitor, thus enabling a decrease in overall size and weight of this energy storage approach compared to the conventional capacitive energy storage approach. Further decrease in size and weight is realized by the pump diode driver employing, in conjunction with a pump diode, a switched-mode power conversion circuit for driving the pump diode.

Accordingly, one aspect of the present invention is a laser driver subsystem that includes a pump diode driver, operable to generate light pulses to energize a solid-state laser, and a lithium polymer battery. The pump diode driver includes a pump diode and a switched-mode power conversion circuit at an input connected to an output of the battery and at an output connected to an anode of the pump diode. The switched-mode power conversion circuit is configured to convert an electrical voltage from a first level at the output of the battery to a second lower voltage level at the pump diode anode so as to provide the pump diode with an electrical current that enables the pump diode to generate the light pulses to operate the laser while only a fraction of that current needs to be supplied by the battery.

Another aspect of the present invention is a system for performing laser-based operations that includes a diode-pumped solid-state laser operable to generate a pulsed output having a wavelength of between about 1064 nm and 1570 nm and a pulse duration of between about 1 ns and 20 ns, a pump diode driver operable to generate light pulses in order to energize the laser, an array of operational components adapted to perform multiple functions in coordination with the pulsed output of the laser, a microcontroller for controlling operation of the operational components and the driver, a lithium polymer battery, and a plurality of power supplies interconnecting the battery and selected ones of the operational components of the array for supplying voltages to the components at different levels required to power the components. The pump diode driver includes a pump diode and a switched-mode power conversion circuit connected to the microcontroller and interconnecting the battery and the pump diode for supplying an electrical current from the battery to the pump diode at a level that enables the pump diode to generate light pulses that energize the solid-state laser to fire, upon receipt of an electrical pulse from the microcontroller.

The foregoing and other objects, features, and advantages will become more apparent from the following detailed description, which proceeds with reference to the accompanying figures.

DETAILED DESCRIPTION OF THE INVENTION

Figure 1:
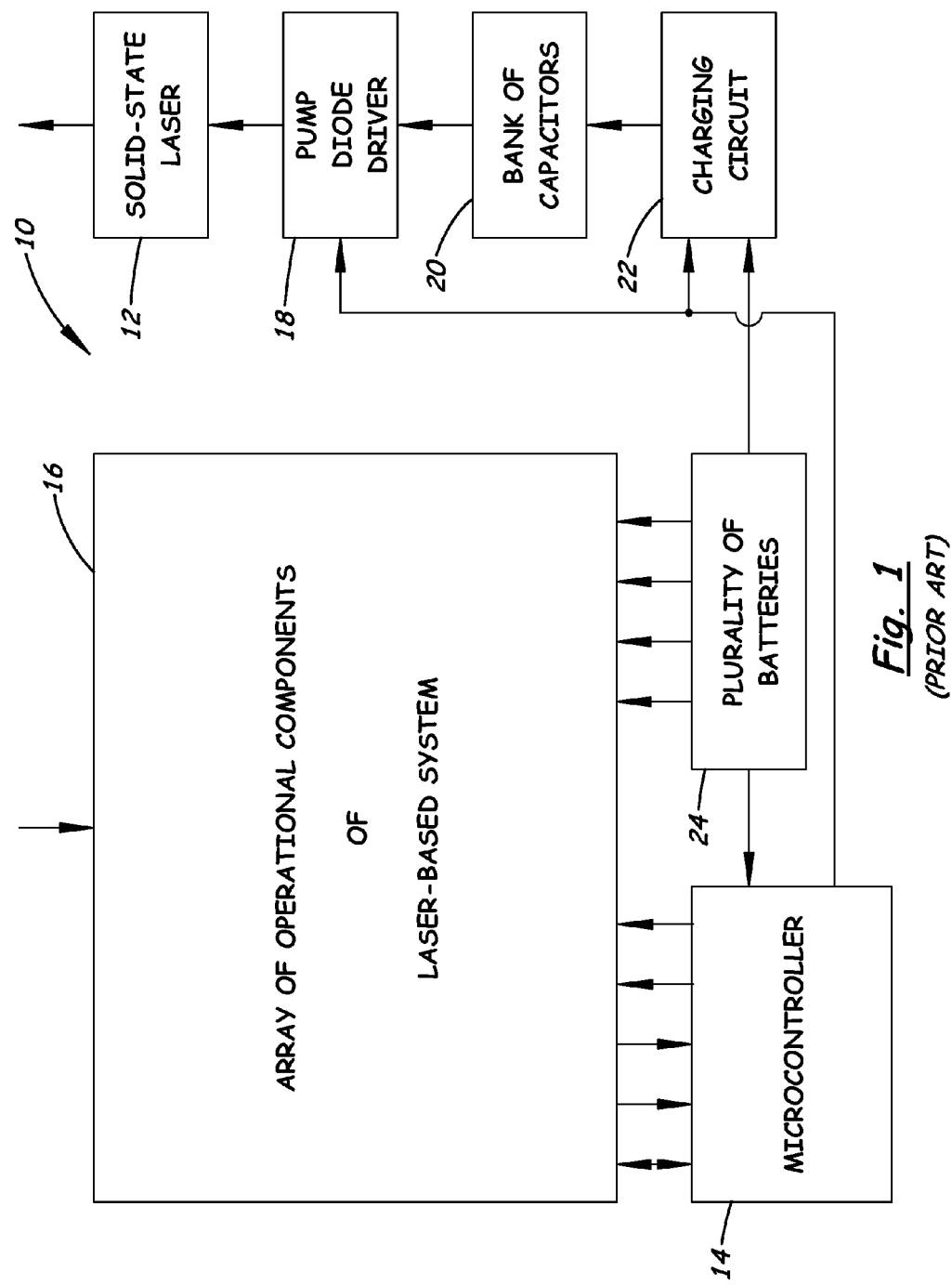
FIG. 1 is a block diagram of an exemplary prior art system for performing laser-based operations.

Referring now to FIG. 1, there is shown in block diagram form an exemplary prior art system, generally designated 10, for performance of laser-based operations. The prior art system 10 includes a solid-state laser 12, a microcontroller 14, an array of operational components 16, a pump diode driver 18, a bank of capacitors 20, a charging circuit 22, and a plurality of batteries 24. By way of example only, the solid-state laser 18 and the operational components 16 of the system 10 may be designed to perform range finding operations and the like. The solid-state laser 12 may generate a pulsed output having a wavelength of between about 1064 nm and 1570 nm and a pulse duration of between about 1 ns and 20 ns. Different ones of the batteries 24 supply electrical power respectively to the microcontroller 14, to selected ones of the operational components 16, and to the charging circuit 22, enabling them to perform their assigned functions.

The bank of capacitors 20 function as an energy storage medium for supplying electrical current pulses to the pump diode driver 18 to enable the driver 18 to fire, upon receipt of an appropriate electrical pulse from the microcontroller 14, and generate light pulses that energize the solid-state laser 12. The charging circuit 22 is coupled to the bank of capacitors 20 for achieving fast charging and discharging of stored energy into and out of the capacitors 20 to enable the driver 18 to be fired to energize the laser 12. The microcontroller 14 provides the overall control of the operation of the components 16 and the discharge of the capacitors 20.

The batteries 24 used are conventional energy storage batteries, such as NiCad, NiMH, or LiMnO2 battery cells, that typically have a voltage of 1.2 to 3 volts per cell and either are disposable after a single use or may be recharged and then reused. Individual ones, or groups, of the batteries 24 are connected to the microcontroller 14, operational components 16 and charging circuit 22, as appropriate for supplying the power requirements thereof. The bank of capacitors 20 may be tantalum, aluminum electrolytic and aluminum polymer capacitors or, alternatively, supercapacitors.

Figure 2:
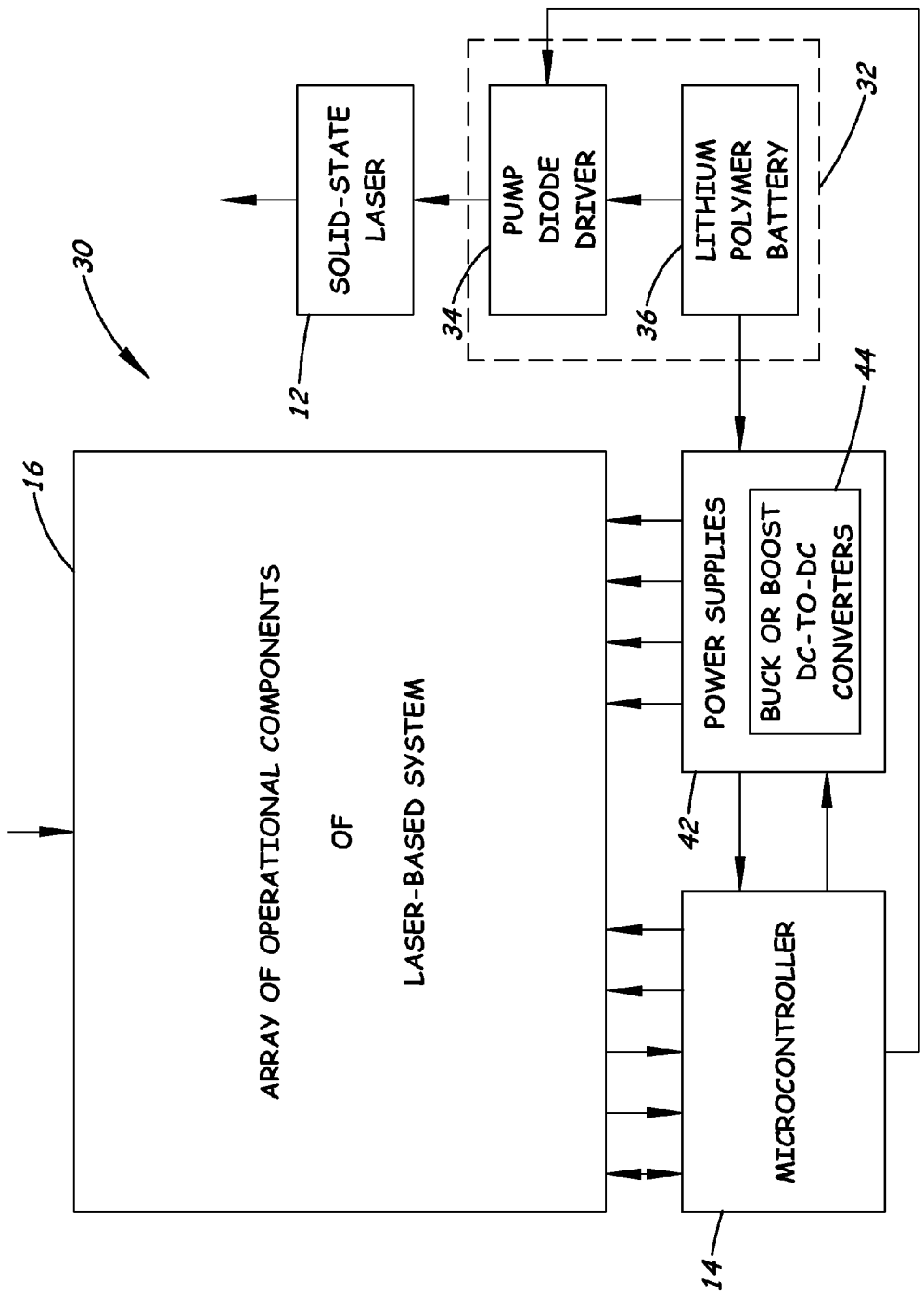
FIG. 2 is a block diagram of an exemplary embodiment of a system for performing laser-based operations in accordance with one aspect of the present invention, and of an enhanced pump laser driver subsystem employed therein in accordance with another aspect of the present invention.
Figure 3:
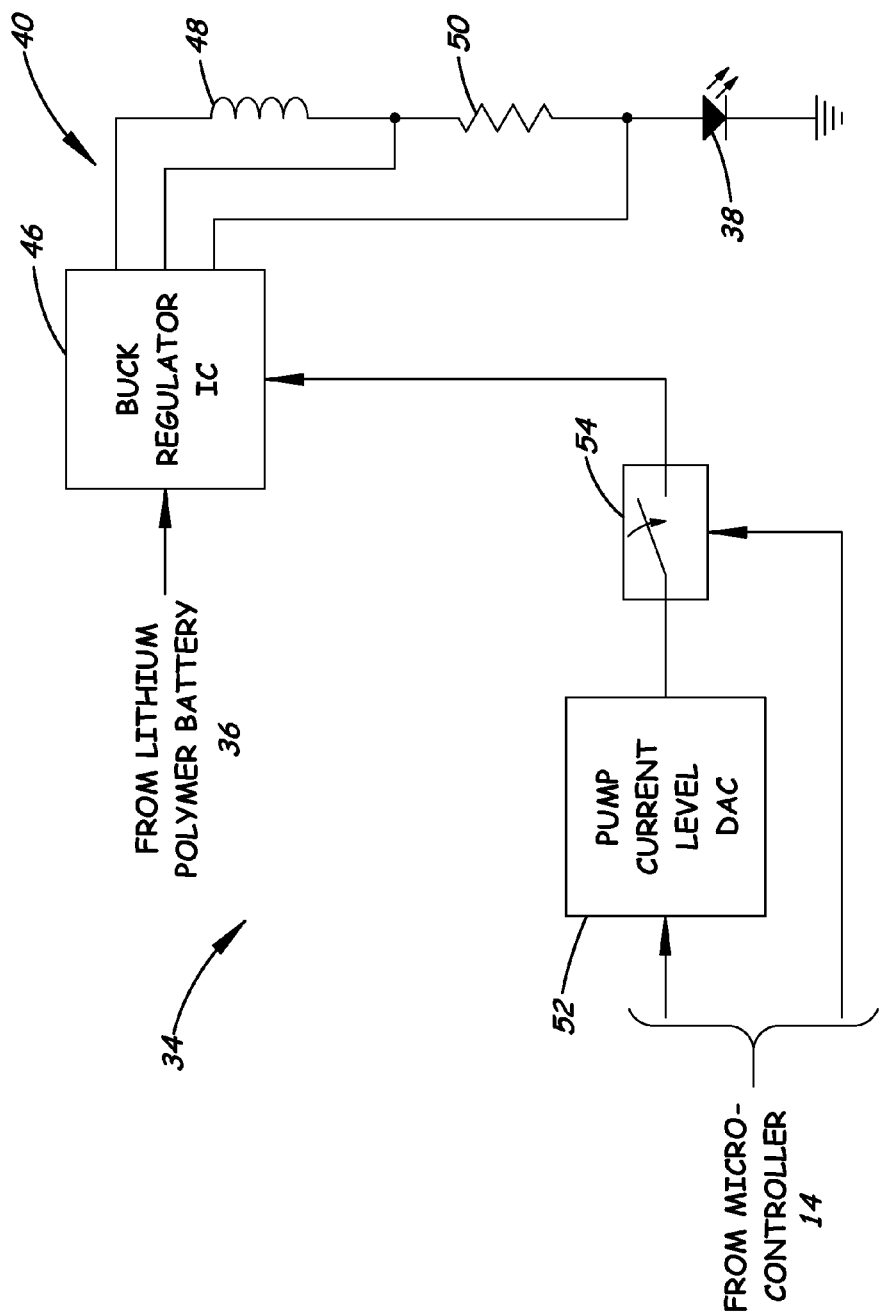
FIG. 3 is a detailed diagram of an exemplary embodiment of the pump diode driver of the subsystem.

Turning now to FIG. 2, there is shown in block diagram form an exemplary embodiment of a system for performing laser-based operations, generally designated 30, in accordance with one aspect of the present invention, and of an enhanced laser driver subsystem, generally designated 32, employed in the system 30 in accordance with another aspect of the present invention. The enhanced laser driver subsystem 32 includes the pump diode driver 34 and a lithium polymer battery 36. The driver 34, which includes a pump diode 38 and a switched-mode power conversion circuit 40 as will be described in detail below in reference to FIG. 3, is operable to generate light pulses having a power of between about 100 W and 1000 W and duration of between about 100 us and 10 ms that are used to energize the solid-state laser 12.

In one example, the lithium polymer battery 36 is a rechargeable 2S (two cell) battery having the following voltage, capacity, discharge rate and internal resistance ratings. The voltage rating of the battery 36 can be a maximum and minimum of 4.2 and 3.0 volts per cell, respectively, and more particularly 3.7 volts per cell. The capacity rating of the battery 36 (how much power it can hold) can be 325 mAh. The abbreviation "mAh" stands for "milliamp hours, which means how much load or drain (measured in milliamps) can be put on the lithium polymer battery 36 for one hour at which time it will be fully discharged. The discharge rate rating of the battery 36 (how fast it can be discharged safely) can be 65 C continuous/130 C bursts. The "65 C continuous" rating indicates that one can safely discharge the battery at a rate 65 times more than its capacity (C). The 130 C burst rating indicates the battery discharge rate, 130 times more than its capacity (C), for short bursts of extended power. The internal resistance rating of the battery 36 can be 1 to 25 milliohms of internal resistance per each cell when the battery is new. The internal resistance rises as the battery ages. From the foregoing, it can be readily understood that the lithium polymer battery 36 has a low internal resistance, enabling fast charging and discharging of the stored energy.

Even though the lithium polymer battery 36 can supply tens to hundreds of amps of current to the pump diode driver 34, it is beneficial to limit the current draw from the battery to as low of a level as possible. One reason for this is that the internal resistance, though low, is not zero. Therefore, the battery voltage may begin to droop while supplying the high levels of current, decreasing efficiency and limiting the amount of energy that can be extracted from the battery. Battery voltage also eventually droops as the battery becomes depleted. Together, this means that the battery will have to be recharged or replaced sooner, even though there may still be energy left in the battery. Maximizing battery lifetime is always desirable, especially in portable applications.

As mentioned above, most applications can benefit from reduced current draw from the lithium polymer battery 36. However, in many examples pump diode 38 may require 100 amps or more to properly pump the laser 12, which must be sourced from somewhere. Such current can be provided with the use of the switched-mode power conversion circuit 40 to increase the current by step-down of the voltage so that the driver voltage will be less than the battery voltage.

In addition to the pump diode driver 34 and the lithium polymer battery 36 of the enhanced laser driver subsystem 32, the laser-based system 30 also includes a plurality of power supplies 42 and the microcontroller 14. The power supplies 42 interconnect the lithium polymer battery 36 with selected ones of the operational components 16 for supplying voltages to the components at levels required to power them. The power supplies 42 may include a plurality of DC-to-DC buck or boost converters 44 being configured to cause the electrical voltage from the battery 36 to selected ones of the components 16 either to step up or step down from the first level at the battery 36 to respective second levels at the components 16 such that electrical currents are supplied to the selected components 16 at the required levels to power them. The DC-to-DC buck or boost converter 44, per se, is well known to one skilled in the art and thus the details of its makeup need not be described herein. In short, the boost converter steps up, or converts, its input voltage to a higher output voltage, whereas the buck convert steps down, or converts, its input voltage to a lower output voltage. By way of example, the second levels of the voltages supplied to the components 16 may be one of +1.8V, +3.3V, +5.0V and +/−12, and to the microcontroller 14 may be +3.3V. The microcontroller 14 is connected to and programmed for controlling the operation of the operational components 16 for performing the laser-based operation of the system 30 and the operation of the switched-mode power conversion circuit 40 for initiating the firing of the pump diode 38.

Referring now to FIG. 3, there is illustrated a detailed diagram of an exemplary embodiment of the pump diode driver 34 of the subsystem 32. As briefly described earlier, the pump diode driver 34 includes the pump diode 38 and the switched-mode power conversion circuit 40, the latter at its input connected to an output of the battery 36 and at its output connected to an anode of the pump diode 38. The switched-mode power conversion circuit 40 is configured to convert an electrical voltage from a first level at the output of the battery 36 to a second lower voltage level at the pump diode anode so as to provide the pump diode 38 with an electrical current that enables the pump diode to generate the light pulses to operate the laser 12 while requiring only a fraction of that current to be supplied by the battery 36. The size and weight of the battery 36 can be minimized accordingly, along with the size and weight of the overall system 30.

The circuit 40 of the driver 34 provides two main functions: controlling the current that flows through the pump diode 38 to a predefined constant level, and controlling the duration over which that current is flowing into the pump diode. The adjustability of both of these parameters allows the driver 34 to be tailored to a variety of laser applications. The driver 34 uses the topology embodied by the switched-mode power conversion circuit to control the level of current that flows from the battery 36 to the pump diode 38. This topology is advantageous because it achieves the highest efficiency and enables a smaller battery to be used as the energy storage medium.

The circuit 40 includes step-down or "buck" regulator integrated circuit (IC) 46 which drives associated high power MOSFETs (not shown) that are operable to switch and control the flow of current through a power inductor 48. In basic terms, the duty cycle of the power switches is directly proportional to the step down ratio of the switched-mode power conversion circuit 40. A sense resistor 50 in series with the inductor 48 and pump diode 38 measures the current flowing from the inductor 48 into the pump diode 38. The buck regulator integrated circuit 46 receives the sensed current as feedback and adjusts the duty cycle of the power MOSFETs or switches to keep the average pump diode current at a programmed level. The level at which the current is regulated is set by a voltage input to the buck regulator IC 46 supplied by a digital-to-analog converter (DAC) 52 that can be adjusted by the system microcontroller 14. An analog switch 54 between the DAC 52 and the buck regulator IC 46 and in series with this voltage provides the control of the duration of the pump diode current pulse. When the switch 54 is in the "off" (or open) position, the buck regulator IC current command is set to zero volts. When the switch 54 is in the "on" (or closed) position, the buck regulator current command is set to voltage level of the DAC 52, corresponding to a particular pump diode current. By way of example and not of limitation, the values for the inductor 48 and sense resistor 50 may be 160 nH and 500 µΩ, respectively.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A laser driver subsystem, comprising:
   a pump diode driver operable to generate light pulses to energize a solid-state laser; and
   a lithium polymer battery;
   wherein said pump diode driver includes
      a pump diode, and
      a switched-mode power conversion circuit at an input connected to an output of said battery and at an output connected to an anode of said pump diode, said switched-mode power conversion circuit being configured to convert an electrical voltage from a first level at the output of said battery to a second lower voltage level at said pump diode anode so as to provide said pump diode with an electrical current that enables said pump diode to generate the light pulses to operate the laser while only a fraction of that current needs to be supplied by said battery.

2. The subsystem of claim 1, wherein said lithium polymer battery has multiple cells.

3. The subsystem of claim 2, wherein said lithium polymer battery has two cells.

4. The subsystem of claim 2, wherein said lithium polymer battery has an initial internal resistance rating of 1 to 25 milliohms per cell.

5. The subsystem of claim 2, wherein said lithium polymer battery has a voltage rating of between a maximum of about 4.2 volts per cell and a minimum of about 3.0 volts per cell.

6. The subsystem of claim 2, wherein said lithium polymer battery has a voltage rating of about 3.7 volts per cell.

7. The subsystem of claim 1, wherein said lithium polymer battery has a capacity rating of about 325 mAh.

8. The subsystem of claim 7, wherein said lithium polymer battery has a continuous discharge rate rating of 65 times more than its capacity rating and a burst discharge rate rating of about 130 times more than its capacity rating.

9. The subsystem of claim 1, wherein said switched-mode power conversion circuit includes
   a buck step-down regulator having a duty cycle directly proportional to a step down ratio of said circuit,
   a power inductor and a sense resistor connected in series between said buck regulator and said pump diode such that said buck regulator functions as a switch with the duty cycle to control the flow of current through said inductor and resistor to said pump diode and said sense resistor measures the current flowing from said inductor into said pump diode and feeds back the sensed current to said buck regulator so that said buck regulator can adjust its duty cycle to keep the average pump diode current at a preselected level, and
   an analog switch connected to an input of said buck regulator and movable between off and on positions to control a voltage level at said input of said buck regulator that provides the control of the duration of the pump diode current pulse.

10. A system for performance of laser-based operations, comprising:
    a diode-pumped solid-state laser operable to generate a pulsed output having a wavelength of between about 1064 nm and 1570 nm and a pulse duration of between about 1 ns and 20 ns;
    a pump diode driver operable to generate light pulses in order to energize said laser;
    an array of operational components adapted to perform multiple functions in coordination with the pulsed output of said laser;
    a microcontroller for controlling operation of said operational components and said driver;
    a lithium polymer battery; and
    a plurality of power supplies interconnecting said battery and selected ones of said operational components for supplying voltages to said components at different levels needed to power said components;
    wherein said pump driver diode includes
       a pump diode, and
       a switched-mode power conversion circuit connected to said microcontroller and interconnecting said battery and said pump diode for supplying an electrical voltage from said battery to said pump diode at a level that enables said pump diode to generate light pulses that energize said solid-state laser fire, upon receipt of an electrical pulse from said microcontroller.

11. The system of claim 10, wherein said lithium polymer battery has multiple cells.

12. The system of claim 11, wherein said lithium polymer battery has two cells.

13. The system of claim 12, wherein said lithium polymer battery has an initial internal resistance rating of 1 to 25 milliohms per cell.

14. The system of claim 12, wherein said lithium polymer battery has a voltage rating between a maximum of 4.2 volts per cell and a minimum of 3.0 volts per cell.

15. The system of claim 12, wherein said lithium polymer battery has a voltage rating of about 3.7 volts per cell.

16. The system of claim 10, wherein said lithium polymer battery has a capacity rating of about 325 mAh.

17. The system of claim 16, wherein said lithium polymer battery has a continuous discharge rate rating of about 65 times more than its capacity rating and a burst discharge rate rating of about 130 times more than its capacity rating.

18. The system of claim 10, wherein said switched-mode power conversion circuit includes a buck step-down regulator having a duty cycle directly proportional to a step down ratio of said circuit, a power inductor and a sense resistor connected in series between said buck regulator and said pump diode such that said buck regulator functions as a switch with the duty cycle to control the flow of current through said inductor and resistor to said pump diode and said sense resistor measures the current flowing from said inductor into said pump diode and feeds back the sensed current to said buck regulator so that said buck regulator can adjust its duty cycle to keep the average pump diode current at a preselected level, and an analog switch connected to an input of said buck regulator and movable between off and on positions to control a voltage level at said input of said buck regulator that provides the control of the duration of the pump diode current pulse.

19. The system of claim 10, wherein said switched mode power conversion circuit includes a topology configured to cause the electrical voltage from said battery to said pump diode to step down from the first level to the second level such that the electrical current at an anode of said pump diode is greater than at the output of said battery.

20. The system of claim 10, wherein said plurality of power supplies includes a plurality of DC-to-DC converters configured to cause the electrical voltages from said battery to said selected ones of said components of said array either to step up or step down from a first level to a second level such that electrical currents are supplied to said selected ones of said components at the required levels to power said selected ones of said components.

* * * * *